(12) United States Patent
Yang et al.

(10) Patent No.: US 11,221,351 B2
(45) Date of Patent: Jan. 11, 2022

(54) PROBE CARD DEVICE

(71) Applicant: PRINCO CORP., Hsinchu (TW)

(72) Inventors: Chih-kuang Yang, Hsinchu (TW);
Yeong-yan Guu, Hsinchu (TW);
Chun-hsiung Chou, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 202 days.

(21) Appl. No.: 16/508,436

(22) Filed: Jul. 11, 2019

(65) Prior Publication Data
US 2020/0103441 A1 Apr. 2, 2020

(30) Foreign Application Priority Data
Oct. 1, 2018 (TW) .................. 107134708

(51) Int. Cl.
| | | |
|---|---|---|
| *G01R 1/073* | (2006.01) | |
| *H05K 1/14* | (2006.01) | |
| *H05K 1/11* | (2006.01) | |
| *H01R 12/77* | (2011.01) | |
| *H01R 13/03* | (2006.01) | |
| *G01R 1/067* | (2006.01) | |
| *H05K 1/09* | (2006.01) | |

(52) U.S. Cl.
CPC ..... *G01R 1/07342* (2013.01); *G01R 1/06761* (2013.01); *G01R 1/0735* (2013.01); *H01R 12/777* (2013.01); *H01R 13/03* (2013.01); *H05K 1/09* (2013.01); *H05K 1/118* (2013.01); *H05K 1/147* (2013.01)

(58) Field of Classification Search
CPC .............. G01R 1/07342; G01R 1/0735; G01R 1/06761; G01R 1/06744; G01R 1/073; G01R 1/07307; G01R 1/07314; H05K 1/147; H05K 1/118; H05K 1/09; H05K 2201/10318; H05K 2201/041; H05K 2201/10704; H05K 1/144; H01R 12/777; H01R 13/03
USPC .......... 324/754.07, 754.03, 754.01, 537, 500
See application file for complete search history.

(56) References Cited

U.S. PATENT DOCUMENTS

| | | | | |
|---|---|---|---|---|
| 5,532,613 A | * | 7/1996 | Nagasawa .......... | G01R 1/06711 137/312 |
| 2004/0085081 A1 | * | 5/2004 | Logelin .............. | G01R 1/07314 324/754.07 |
| 2005/0001643 A1 | * | 1/2005 | Yoshida ............. | G01R 1/07342 324/754.07 |
| 2006/0152239 A1 | * | 7/2006 | Nam .................. | G01R 31/2877 324/750.05 |
| 2006/0279304 A1 | * | 12/2006 | Kuitani ............... | G01R 35/005 324/750.22 |

(Continued)

FOREIGN PATENT DOCUMENTS

| | | |
|---|---|---|
| TW | M506970 U | 8/2015 |
| TW | M521177 U | 5/2016 |
| TW | 201805636 A | 2/2018 |

*Primary Examiner* — Giovanni Astacio-Oquendo
(74) *Attorney, Agent, or Firm* — Hauptman Ham, LLP

(57) ABSTRACT

A probe card device includes a probe head including a plurality of pins, wherein each of the pins includes a body, a first metal layer formed on the body, and a second metal layer covering the first metal layer; a multi-layered flexible board electrically connected to the pins; a support plate, the multi-layered flexible board disposed on a first surface of the support plate; and a circuit board electrically connected to the multi-layered flexible board.

10 Claims, 3 Drawing Sheets

(56) References Cited

U.S. PATENT DOCUMENTS

| | | | |
|---|---|---|---|
| 2008/0278185 A1* | 11/2008 | Chen | G01R 3/00 324/754.07 |
| 2014/0091827 A1* | 4/2014 | Hung | G01R 1/07378 324/756.03 |
| 2014/0224527 A1* | 8/2014 | Chiu | H05K 3/4673 174/251 |
| 2015/0033553 A1* | 2/2015 | Wu | G01R 31/2889 29/831 |
| 2016/0225686 A1* | 8/2016 | Spory | H01L 24/49 |
| 2017/0343582 A1 | 11/2017 | Yang et al. | |
| 2020/0404436 A1* | 12/2020 | Meyer | H04R 25/556 |
| 2021/0123950 A1* | 4/2021 | Vettori | G01R 1/0735 |

* cited by examiner

PROBE CARD DEVICE

FIELD OF INVENTION

The present disclosure relates to a field of testing, and particularly to a probe card device.

BACKGROUND

In conventional probe card devices, pins are elements for contacting chip contact pads disposed on a wafer to electrically test the chip contact pads.

The pins are electrically connected to a circuit board, and the circuit board is disposed on a support plate by an intermediate adhesive. Due to uneven distribution of the intervening adhesive, heights of all the pins are inconsistent. When performing an electrical test, some pins contact the chip contact pads, but some probes do not contact the chip contact pads.

Furthermore, adhesive force of the intermediate adhesive will weaken, so the pins will easily peel off or be pulled and broken by an external force, resulting in a shortened service life of the pins.

Therefore, there is a need to propose a solution to the problems of the probe card device in the prior art.

SUMMARY OF DISCLOSURE

The present disclosure provides a probe card device that can solve the problem in the prior art.

A probe card device according to an embodiment of the present disclosure, comprising: a probe head comprising a plurality of pins, wherein each of the pins comprises a body, a first metal layer formed on the body, and a second metal layer covering the first metal layer; a multi-layered flexible board electrically connected to the pins; a support plate, wherein the multi-layered flexible board is disposed on a first surface of the support plate, there is an adhesive force between the multi-layered flexible board and the first surface of the support plate, and no intermediate adhesive is formed between the multi-layered flexible board and the first surface of the support plate; and a circuit board electrically connected to the multi-layered flexible board.

A probe card device according to another embodiment of the present disclosure, comprising: a probe head comprising a plurality of pins, wherein each of the pins comprises a body, a first metal layer formed on the body, and a second metal layer covering the first metal layer; a multi-layered flexible board electrically connected to the pins; a support plate, wherein the multi-layered flexible board is disposed on a first surface of the support plate; and a circuit board electrically connected to the multi-layered flexible board.

In the probe card devices of the present disclosure, no intermediate adhesive is formed between the multi-layered flexible board and the support plate, so that heights of the pins are uniform. Furthermore, the support plate is a rigid plate that can provide supporting force to the multi-layered flexible board, so that there is a strong adhesive force between the pins and the multi-layered flexible board. Finally, because the body is embedded in pads of the multi-layered flexible board, the pins can be firmly engaged with the corresponding pads.

DETAILED DESCRIPTION

Figure 1:
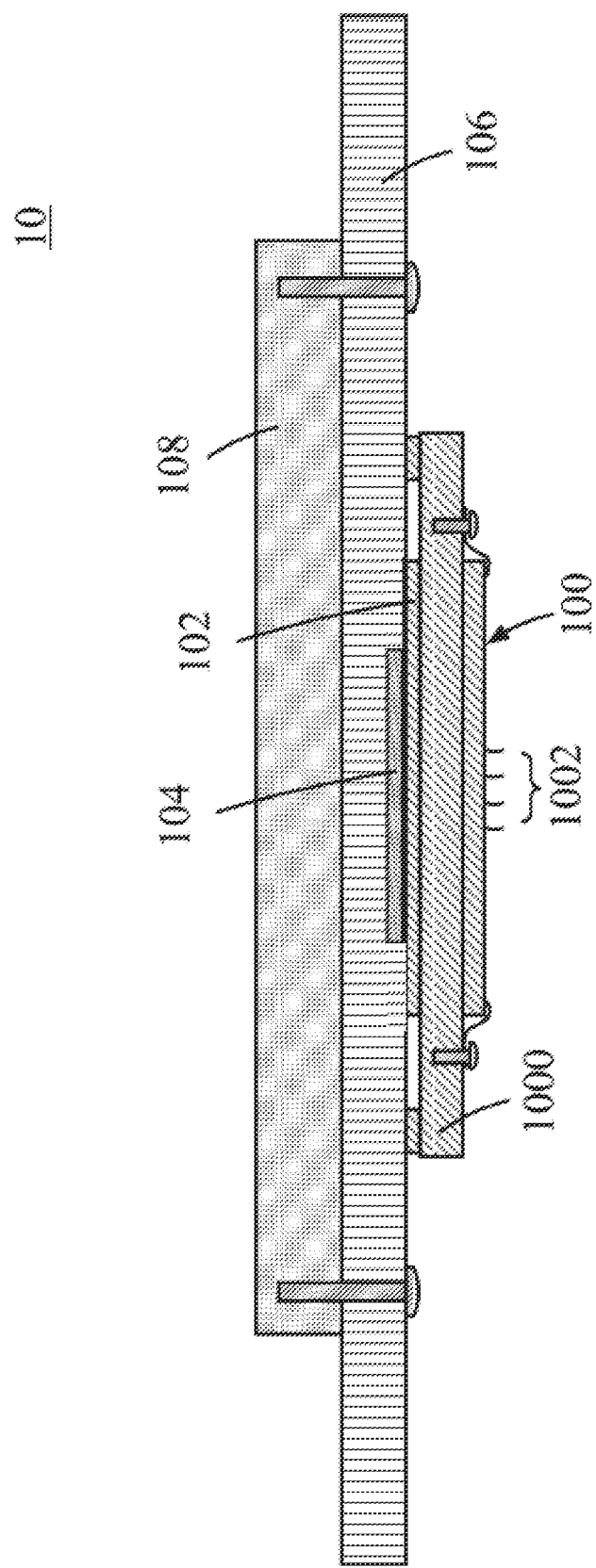
FIG. 1 shows a longitudinal cross-sectional view of a probe card device according to an embodiment of the present disclosure.

Please refer to FIG. 1, which shows a longitudinal cross-sectional view of a probe card device 10 according to an embodiment of the present disclosure.

The probe card device 10 comprises a probe head 100, a multi-layered flexible board 102, a support plate 104, a circuit board 106, and a reinforcement component 108.

The probe head 100 comprises a housing 1000 and a plurality of pins 1002 disposed in the housing 1000 and passing through the housing 1000. The multi-layered flexible board 102 is electrically connected to the pins 1002.

The multi-layered flexible board 102 is disposed on a first surface of the support board 104. The first surface is a side facing the pins 1002.

A feature of the present disclosure is that there is a strong adhesive force between the multi-layered flexible board 102 and the first surface of the support board 104. The strong adhesive force is produced by characteristics of the first surface of the support plate 104. Alternatively, the strong adhesive force is produced by increasing surface energy of the first surface of the support plate 104 (e.g., increasing the surface energy of the first surface of the support plate 104 by plasma treatment). That is to say, in the present disclosure, no intermediate adhesive is formed between the multi-layered flexible board 102 and the first surface of the support plate 104.

Because no intermediate adhesive is formed between the multi-layered flexible board 102 and the support plate 104, heights of the pins 1002 are uniform. Furthermore, the support plate 104 is a rigid plate that can provide supporting force to the multi-layered flexible board 102. Therefore, there is a strong adhesive force between the pins 1002 and the multi-layered flexible board 102 so that the pins 1002 does not easily peel off or be pulled and broken by an external force.

The multi-layered flexible board 102 is used to electrically connect the pins 1002 arrayed in a narrow pitch to the circuit board 106 arrayed in a wide pitch. That is to say, the multi-layered flexible board 102 can be regarded as a space transformer.

One end of each of the pins 1002 is used for electrically connecting one of a plurality of pads of the multi-layered flexible board 102, and the other end of each of the pins 1002 is used for electrically contacting a chip contact pad of a chip to be tested (not shown).

The circuit board 106 is electrically connected to the multi-layered flexible board 102. The circuit board 106 is fixed to the reinforcement component 108. The circuit board 106 is configured to transmit one or more test signals of a test system (not shown). The one or more test signals are transmitted to the pins 1002 through the multi-layered flexible board 102. The pins 1002 contact the chip contact pads of the chip to be tested to electrically test on the chip contact pads.

In an embodiment, the support plate 104 is a piece of glass. The multi-layered flexible board 102 is an organic multi-layered flexible board.

Figure 2:
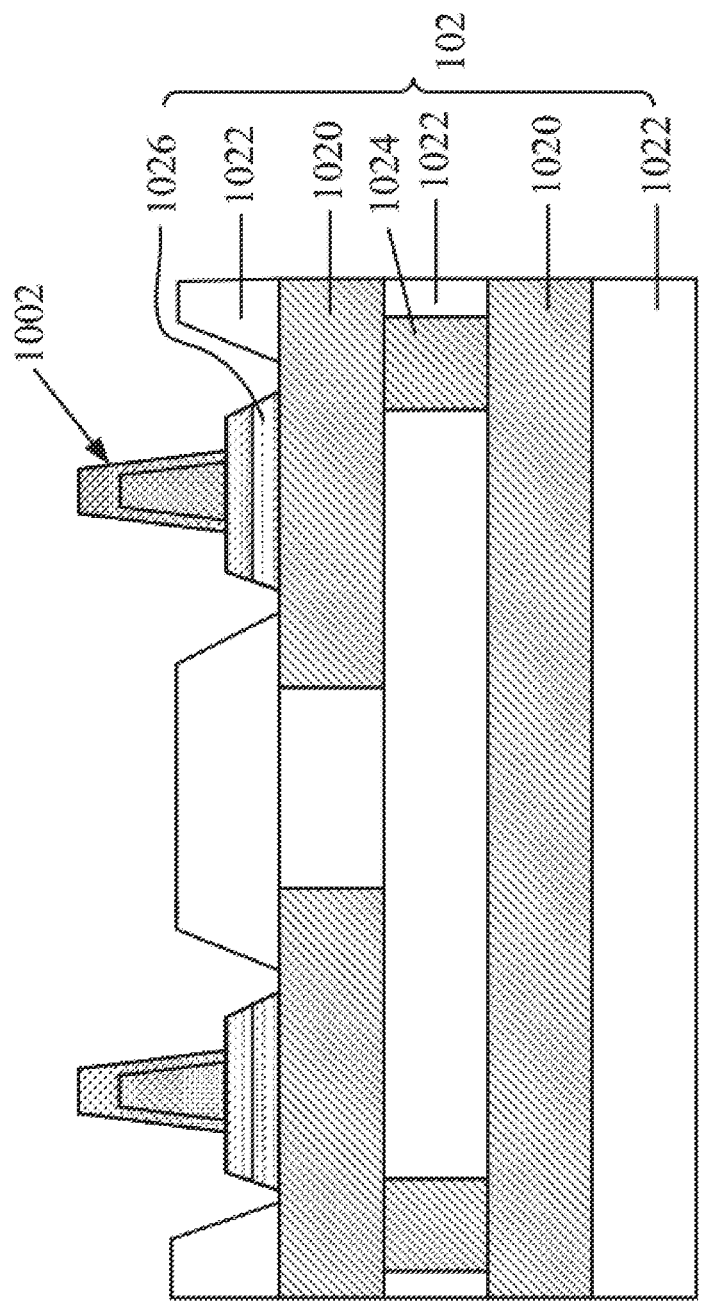
FIG. 2 shows a schematic diagram of a multi-layered flexible board and pins of FIG. 1.
Figure 3:
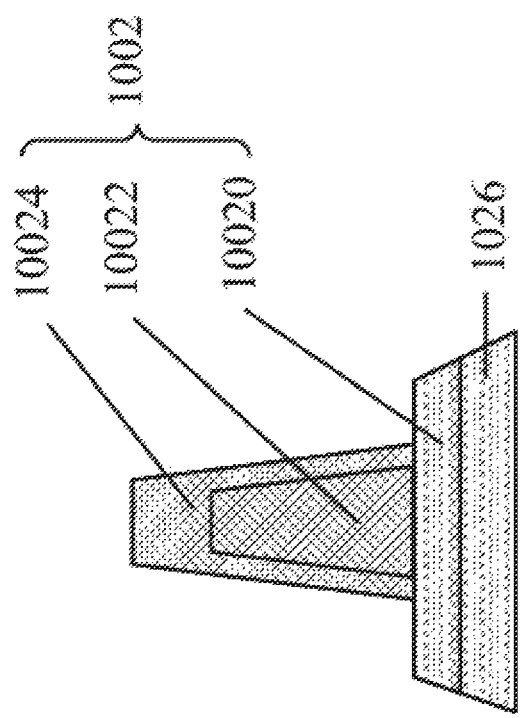
FIG. 3 shows an enlarged schematic diagram of one of the pins of FIG. 1.

Please refer to FIG. 2 and FIG. 3. FIG. 2 shows a schematic diagram of the multi-layered flexible board 102 and the pins 1002. FIG. 3 shows an enlarged schematic diagram of one of the pins 1002.

The multi-layered flexible board 102 comprises a plurality of metal layers 1020 and a plurality of dielectric layers 1022 that are alternately disposed. The plurality of metal layers 1020 are electrically connected to each other by pilot holes 1024. The multi-layered flexible board 102 further comprises a plurality of pads 1026 for electrically connecting to the pins 1002.

Another feature of the present disclosure is that each of the pins 1002 has a special structure.

Each of the pins 1002 comprises a body 10020, a first metal layer 10022, and a second metal layer 10024.

The body 10020 is formed in the pad 1026. More specifically, the body 10020 is embedded in the pad 1026. The first metal layer 10022 is formed on the body 10020. The second metal layer 10024 covers the first metal layer 10022. The body 10020, the first metal layer 10022, and the second metal layer 10024 are formed by coating.

Because the body 10020 is embedded in the pad 1026, the pins 1002 can be firmly engaged with the pad 1026.

The body 10020 and the first metal layer 10022 comprise copper. The second metal layer 10024 comprises electroless nickel electroless palladium immersion gold (ENEPIG). Copper has characteristics of low resistance and low hardness. Electroless nickel electroless palladium immersion gold has characteristics of high hardness, corrosion resistance, and low-order contact resistance. Therefore, the present disclosure coats copper with electroless nickel electroless palladium immersion gold, so that the pins 1002 have the characteristics of copper and electroless nickel electroless palladium immersion gold.

Furthermore, copper (the first metal layer 10022) has a low miscibility temperature with electroless nickel electroless palladium immersion gold (the second metal layer 10024). Therefore, when the first metal layer 1022 is thermally bonded to the second metal layer 1024, high temperature is not required.

In the probe card device of the present disclosure, no intervening glue is formed between the multi-layered flexible board and the support plate, so the heights of the probes are uniform. Moreover, the support plate is a rigid plate which can provide supporting force to the multi-layered flexible board, so that the probes have strong adhesion with the multi-layered flexible board. Finally, since the body is embedded in the pad, the probe can be firmly engaged with the corresponding pad.

In the probe card de-ices of the present disclosure, no intermediate adhesive is formed between the multi-layered flexible board and the support plate, so that heights of the pins are uniform. Furthermore, the support plate is a rigid plate that can provide supporting force to the multi-layered flexible board, so that there is a strong adhesive force between the pins and the multi-layered flexible board. Finally, because the body is embedded in pads of the multi-layered flexible board, the pins can be firmly engaged with the corresponding pads In the above, the present disclosure has been disclosed in the above preferred embodiments, but the preferred embodiments are not intended to limit the present disclosure, and those skilled in the art may make various modifications without departing from the scope of the present disclosure. The protective scope of the present disclosure is determined by the claims.

What is claimed is:

1. A probe card device, comprising:
   a probe head comprising a housing and a plurality of pins disposed in the housing and penetrating the housing, wherein each of the pins comprises:
   a body shaped as a flat plate;
   a first metal layer shaped as a truncated cone, wherein a bottom surface of the truncated cone is directly connected to a first surface of the body; and
   a second metal layer directly covering the first metal layer;
   a multi-layered flexible board, wherein a part of the multi-layered flexible board is embedded in the housing, a second surface of the body of each of the pins away from the first metal layer is directly connected to a surface of the multi-layered flexible board close to the pins;
   a support plate directly disposed on a surface of the multi-layered flexible board away from the pins and configured to support the multi-layered flexible board, wherein a surface of the support plate facing the multi-layered flexible board has a surface energy sufficient to make the support plate directly adhere to the multi-layered flexible board; and
   a circuit board directly disposed on a surface of the support plate away from the multi-layered flexible board and electrically connected to the pins through the multi-layered flexible board.

2. The probe card device according to claim 1, wherein the multi-layered flexible board comprises;
   a plurality of metal layers;
   a plurality of dielectric layers alternately disposed with the metal layers, wherein the dielectric layer between every two metal layers is provided with a plurality of pilot holes, and the metal layers are electrically connected to each other through the pilot holes; and
   a plurality of pads directly disposed on the metal layer closest to the pins, wherein a part of the body of each of the pins is embedded in the corresponding pad, and the second surface of the body of each of the pins directly contacts the corresponding pad.

3. The probe card device according to claim 2, wherein the layer closest to the support plate in the multi-layered flexible board is the dielectric layer to which the support plate directly adheres.

4. The probe card device according to claim 1, wherein the body of each of the pins comprises copper.

5. The probe card device according to claim 1, wherein the first metal layer of each of the pins comprises copper.

6. The probe card device according to claim 1, wherein the second metal layer of each of the pins comprises electroless nickel electroless palladium immersion gold.

7. The probe card device according to claim 1, wherein no intermediate adhesive is formed between the multi-layered flexible board and the support plate.

8. The probe card device according to claim 1, wherein heights of the pins are uniform.

9. The probe card device according to claim 1, wherein the surface energy of the first surface of the support plate is produced by plasma treatment.

10. The probe card device according to claim 1, wherein the support plate is a piece of glass.

* * * * *